US011365983B2

(12) United States Patent
Senkal et al.

(10) Patent No.: US 11,365,983 B2
(45) Date of Patent: Jun. 21, 2022

(54) DEMODULATION PHASE CALIBRATION USING EXTERNAL INPUT

(71) Applicant: INVENSENSE, INC., San Jose, CA (US)

(72) Inventors: Doruk Senkal, San Jose, CA (US); Houri Johari-Galle, San Jose, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 771 days.

(21) Appl. No.: 16/217,509

(22) Filed: Dec. 12, 2018

(65) Prior Publication Data

US 2019/0120657 A1 Apr. 25, 2019

Related U.S. Application Data

(63) Continuation-in-part of application No. 15/173,530, filed on Jun. 3, 2016, now Pat. No. 10,267,650.
(Continued)

(51) Int. Cl.
*G01C 25/00* (2006.01)
*G01C 19/5776* (2012.01)
(Continued)

(52) U.S. Cl.
CPC ............ *G01C 25/005* (2013.01); *B81B 7/008* (2013.01); *B81B 7/0045* (2013.01); *G01C 19/5719* (2013.01); *G01C 19/5726* (2013.01); *G01C 19/5776* (2013.01); *G01R 19/0038* (2013.01); *G01R 23/005* (2013.01); *G01R 25/00* (2013.01);
(Continued)

(58) Field of Classification Search
CPC ............ G01C 25/005; G01C 19/5719; G01C 19/5726; G01C 19/5776; B81B 2201/0242
See application file for complete search history.

(56) References Cited

U.S. PATENT DOCUMENTS 7,793,541 B2 * 9/2010 Challoner .......... G01C 19/5684
73/504.13
10,267,650 B2 4/2019 Senkal et al.
(Continued)

FOREIGN PATENT DOCUMENTS

WO  WO2015069359  5/2015

OTHER PUBLICATIONS

International Preliminary Report on Patentability received for PCT Patent Application No. PCT/US2017/035267, dated Dec. 13, 2018, 9 pages.
(Continued)

*Primary Examiner* — Paul M. West
(74) *Attorney, Agent, or Firm* — Haley Guiliano LLP; Joshua Van Hoven

(57) ABSTRACT

A MEMS device may output a signal during operation that may include an in-phase component and a quadrature component. An external signal having a phase that corresponds to the quadrature component may be applied to the MEMS device, such that the MEMS device outputs a signal having a modified in-phase component and a modified quadrature component. A phase error for the MEMS device may be determined based on the modified in-phase component and the modified quadrature component.

21 Claims, 12 Drawing Sheets

Related U.S. Application Data

(60) Provisional application No. 62/598,332, filed on Dec. 13, 2017.

(51) Int. Cl.
| | | |
|---|---|---|
| *G01C 19/5719* | (2012.01) | |
| *G01C 19/5726* | (2012.01) | |
| *B81B 7/00* | (2006.01) | |
| *G01R 29/02* | (2006.01) | |
| *G01R 19/00* | (2006.01) | |
| *G01R 23/00* | (2006.01) | |
| *G01R 25/00* | (2006.01) | |

(52) U.S. Cl.
CPC ...... *G01R 29/02* (2013.01); *B81B 2201/0242* (2013.01); *B81B 2207/03* (2013.01)

(56) References Cited

U.S. PATENT DOCUMENTS

| | | |
|---|---|---|
| 10,746,565 B2 | 8/2020 | Senkal et al. |
| 2013/0268228 A1 | 10/2013 | Opris |
| 2015/0057959 A1 | 2/2015 | Ezekwe |
| 2015/0114082 A1 | 4/2015 | Blanchard |
| 2015/0192415 A1* | 7/2015 | Ge .............. G01C 19/5684 73/504.13 |
| 2016/0084654 A1 | 3/2016 | Senkal et al. |
| 2017/0350722 A1 | 12/2017 | Senkal et al. |
| 2019/0226871 A1 | 7/2019 | Senkal et al. |

OTHER PUBLICATIONS

International Search Report and Written Opinion received for PCT Patent Application No. PCT/US2017/035267, dated Aug. 25, 2017, 10 pages.

\* cited by examiner

_US 11,365,983 B2_

DEMODULATION PHASE CALIBRATION USING EXTERNAL INPUT

CROSS-REFERENCE TO RELATED APPLICATIONS

The present application claims priority to U.S. Provisional Application No. 62/598,332, filed Dec. 13, 2017, and entitled "DEMODULATION PHASE CALIBRATION USING EXTERNAL INPUT," and is a Continuation-in-Part of U.S. application Ser. No. 15/173,530, filed Jun. 3, 2016, and entitled "DEMODULATION PHASE CALIBRATION," both of which are hereby incorporated by reference herein in their entireties.

BACKGROUND

Micro-electromechanical systems (MEMS) and their use has become prevalent. For example, MEMS may be used as an accelerometer, gyroscope, optical switching, microphones, silicon pressure sensor, magnetic sensor, etc., in various industries such as the airbag industry, the aviation industry, the display industry, the tire pressure industry, etc. Unfortunately, package stress and other causes may cause error and degradation in the performance of the MEMS structure. For example, package stress may induce an offset shift in a MEMS structure, e.g., a quadrature shift in a gyroscope, resulting in an error by introducing error in gyroscope demodulation phase angle.

SUMMARY OF THE INVENTION

Accordingly, a need has arisen to determine errors introduced, e.g., by package stress, and further to calibrate the MEMS structure in order to improve the performance of the MEMS device. Provided herein is a method and system for determining an error resulting from various factors such as package stress. The determined error may be used to calibrate the demodulation phase of a gyroscope in order improve performance of the gyroscope.

According to some embodiments, a method includes receiving a signal from a sensor, wherein the signal comprises a first in-phase component and a first quadrature component. The method further includes identifying the first in-phase component. The method also includes identifying the first quadrature component. A rate signal may be applied to the sensor, wherein the sensor in response to the applying the rate signal generates a sensed rate signal. A second in-phase component associated with the sensed rate signal and a second quadrature component associated with the sensed rate signal may be determined. A phase error may be determined based on the first and the second in-phase components, and the first and the second quadrature components.

The first in-phase component, the first quadrature component, and the second in-phase component and the second quadrature component can be identified through sequential demodulation of the signal and the sensed rate signal. The first in-phase component can be identified through demodulation of the signal using a first demodulator, and the first quadrature component can be identified through demodulation of the signal using a second demodulator. It is appreciated that the first demodulator may be independent from the second demodulator, and the first demodulator and the second demodulator may be configured to identify the first in-phase component and the first quadrature component simultaneously.

It is appreciated that the second in-phase component may be determined through demodulation of the sensed signal using the first demodulator, and the second quadrature component may be determined through demodulation of the sensed signal using the second demodulator, and the first demodulator and the second demodulator may be configured to identify the second in-phase component and the second quadrature component of the sensed rate signal simultaneously.

The method may further include applying a rotation to the sensor to generate the rate signal. In some embodiments, the method may include changing rotation rate of the sensor to generate a change in the rate signal. For example, the change in rotation rate may occur by applying an electrostatic force, a magnetic force, and a piezoelectric force.

The method may further include determining a difference of the first quadrature component and the second quadrature component to generate a quadrature difference, determining a difference of the first in-phase component and the second in-phase component to generate an in-phase difference, and determining the phase error by processing an arctangent of the quadrature difference and the in-phase difference.

In some embodiments, the method may further include reducing error in measurements associated with the sensor by dynamically compensating for the determined phase error. It is appreciated that a clock signal may be modified based on the determined phase error to reduce error, and the modified clock may be used in determining in-phase and quadrature components.

The method may further include changing a demodulation phase of a demodulator used to identify the first in-phase component, the first quadrature component, the second in-phase component, and the second quadrature component.

It is appreciated that the sensor device may be a micro-electromechanical system gyroscope.

It is appreciated that the phase error detection may occur in response to detecting a motion. The method may include periodically applying another rate signal to the sensor to generate another sensed signal, determining another in-phase component and another quadrature component associated with another sensed rate signal, and updating the phase error based on the determining another in-phase component and the another quadrature component associated with the another sensed rate signal.

It is appreciated that in some embodiments the method may include determining a difference of the first quadrature component and the second quadrature component to generate a quadrature difference, determining a difference of the first in-phase component and the second in-phase component to generate an in-phase difference, and determining sensitivity associated with the sensor based on the quadrature difference and the in-phase difference.

In some embodiments, a device may include a sensor device, a first demodulator, a second demodulator, and a processing unit. The sensor device may be configured to generate a signal comprising a first in-phase component and a first quadrature component. The first demodulator may be configured to identify the first in-phase component. The second demodulator may be configured to identify the second quadrature component. The processing unit may be configured to determine a phase error associated with the sensor device. It is appreciated that the phase error may be determined based on the first quadrature component and the first in-phase component and may be further based on a second in-phase component associated with a sensed rate signal and a second quadrature component associated with the sensed rate signal. It is appreciated that the first in-phase component may be determined by the first demodulator and the first quadrature component may be determined by the second demodulator. According to some embodiments, the sensed rate signal may be generated by the sensor device in response to application of a rate signal thereto.

In some embodiments, the device may further include a first filter coupled to the first demodulator. The first filter may be configured to generate an averaged in-phase component signal for transmission to the processing unit for determining the phase error. The device may also include a second filter coupled to the second demodulator. The second filter may be configured to generate an averaged quadrature component signal for transmission to the processing unit for determining the phase error. According to some embodiments, the first filter and the second filter are selected from a group consisting of a low pass filter, integrator, and a bandpass filter.

It is appreciated that the sensor device may be a micro-electromechanical system gyroscope.

The processing unit may be configured to calculate a difference between the first quadrature component and the second quadrature component to generate a quadrature component difference. It is appreciated that the processing unit may be further configured to calculate a difference between the first in-phase component and the second in-phase component to generate an in-phase component difference. In some embodiments, the processing unit is further configured to determine the phase error by calculating the arctangent of the quadrature component difference and the in-phase component difference. In some embodiments, the processing unit is selected from a group consisting of a central processor, a field programmable gate array (FPGA), and an application specific integrated circuit (ASIC).

According to some embodiments, output readings from the sensor device may be calibrated to compensate for the phase error.

In some embodiments, the processing unit may be configured to calculate a difference between the first quadrature component and the second quadrature component to generate a quadrature component difference. The processing unit may further be configured to calculate a difference between the first in-phase component and the second in-phase component to generate an in-phase component difference. In some embodiments, the processing unit may be further configured to determine sensitivity of the sensor device based on the quadrature component difference and the in-phase component difference.

In some embodiments, a device may include a sensor device, a demodulator, and a processing unit. The sensor device may be configured to generate a signal comprising a first in-phase component and a first quadrature component. The demodulator may be configured to sequentially identify the first in-phase component and the first quadrature component. In some embodiments, the processing unit may be configured to determine a phase error associated with the sensor device. It is appreciated that the phase error may be determined based on the first quadrature component and the first in-phase component and is further based on a second in-phase component associated with a sensed rate signal and a second quadrature component associated with the sensed rate signal. According to some embodiments, the second in-phase component and the second quadrature component may be sequentially determined by the demodulator. In some embodiments, the sensed rate signal may be generated by the sensor device in response to application of a rate signal thereto.

The device may include a filter coupled to the demodulator. The filter may be configured to generate an averaged component signal received from the demodulator. In some embodiments, the filter is selected from a group consisting of a low pass filter, integrator, and a bandpass filter. According to some embodiments the averaged component signal may be transmitted to the processing unit for determining the phase error.

It is appreciated that the sensor device may be a micro-electromechanical system gyroscope.

The processing unit may be configured to calculate a difference between the first quadrature component and the second quadrature component to generate a quadrature component difference. In some embodiments the processing unit may be further configured to calculate a difference between the first in-phase component and the second in-phase component to generate an in-phase component difference. It is appreciated that the processing unit may further be configured to determine the phase error by calculating the arctangent of the quadrature component difference and the in-phase component difference. It is appreciated that the processing unit may be selected from a group consisting of a central processor, a field programmable gate array (FPGA), and an application specific integrated circuit (ASIC). According to some embodiments, output readings from the sensor device is calibrated to compensate for the phase error.

In some embodiments of the present disclosure, a method for determining a phase error for a micro-electromechanical system (MEMS) device comprises receiving a first signal from the MEMS device, wherein the first signal comprises an in-phase component and a quadrature component, and applying an external signal to the MEMS device, wherein the phase of the external signal corresponds to the phase of the quadrature component. The method may further comprise receiving a second signal from the MEMS device, wherein the second signal is generated by the MEMS device based on the external signal, and wherein the second signal comprises a modified in-phase component and a modified quadrature component. The method may further comprise determining the phase error for the MEMS device based on the modified in-phase component and the modified quadrature component.

In some embodiments of the present disclosure, a micro-electromechanical system (MEMS) device may comprise a suspended spring-mass system and a sense system, wherein the sense system receives a first signal based on movement of the suspended spring-mass system, wherein the first signal comprises an in-phase component and a quadrature component. The MEMS device may further comprise a drive system, wherein the drive system applies an external signal to the MEMS device, wherein the phase of the external signal corresponds to the phase of the quadrature component, wherein the sense system receives a second signal generated by the suspended spring-mass system based on the external signal, and wherein the second signal comprises a modified in-phase component and a modified quadrature component. The MEMS device may further comprise processing circuitry configured to determine a phase error for the MEMS device based on the modified in-phase component and the modified quadrature component.

In some embodiments of the present disclosure, a device may comprise a sensor device configured to generate a first signal and a second signal, wherein the first signal comprises an in-phase component and a quadrature component, wherein the second signal is based on an external signal applied to the sensor device and having a phase that corresponds to the phase of the quadrature component, and wherein the second signal generated by the suspended spring-mass system comprises a modified in-phase component and a modified quadrature component. The device may further comprise a processing unit configured to determine a phase error for the sensor device based on the modified in-phase component and the modified quadrature component.

These and other features and aspects of the concepts described herein may be better understood with reference to the following drawings, description, and appended claims.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

Figure 1B:
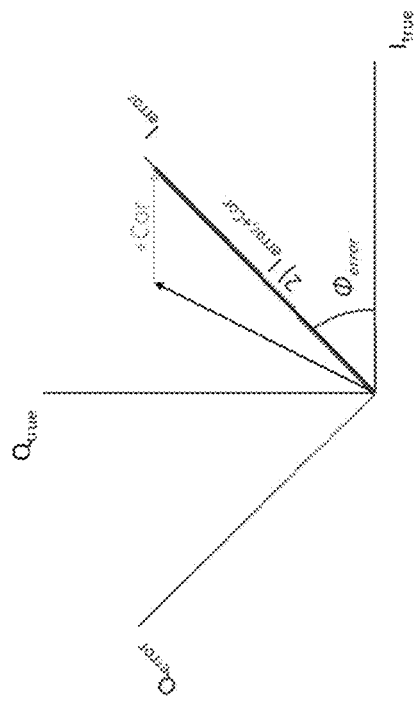
FIGS. 1A-1C show orientation of Coriolis vector in phase domain for calculating a phase error in accordance with some embodiments of the present disclosure.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to determine errors introduced, e.g., by package stress, and further to calibrate the MEMS structure in order to improve the performance of the MEMS device. Provided herein is a method and system for determining an error resulting from various factors such as package stress. The determined error may be used to calibrate the demodulation phase of a gyroscope in order improve performance of the gyroscope.

In an exemplary embodiment of the present disclosure, a phase error may be determined by applying an external force to a MEMS device. The external signal may have a phase that corresponds to a quadrature component of a received signal from the MEMS device. By applying a known external signal under certain conditions, and/or by varying the external signal, the overall response signal may be varied based solely on the known external signal. An in-phase component and a quadrature component may be determined from the response signal and compared to baseline signals, such as in-phase and quadrature signals previously determined from a prior response signal under baseline conditions (e.g., without application of the external signal, and with a known rate of rotation or with a minimal rate of rotation). Based on the known input of the quadrature-related external signal or signals, the values associated with the baseline conditions, and the measured response signal or signals associated with the quadrature-related external signal or signals, a phase error may be determined. This phase error may then be used to modify the calculation of rate of rotation, for example, by modifying a demodulation phase angle used to demodulate received rate signals or by modifying an output signal of the gyroscope.

In an exemplary embodiment, the external signal may be applied as a periodic signal, for example, using capacitive or piezoelectric forces. While the MEMS device (e.g., MEMS gyroscope) is being driven in a normal manner, the external force may also be applied, but such that the force is sensed by output components (e.g., sense electrodes) of the MEMS device as a change in the quadrature component of the sensed signal. In some embodiments, an additional signal may be applied to drive circuitry (e.g., drive electrodes that apply a force to a drive mass) that is out of phase (e.g., 90° out of phase) with the signal that drives the MEMS device. In additional embodiments, the external signal may be applied by other components, such as electrodes that are used for sensing movement of masses (e.g., drive sense electrodes configured to sense movement of a drive mass, intermediate masses, and/or sense masses) of a suspended spring-mass system of a sensor such as a MEMS gyroscope. It will be understood that depending on the relative location (e.g., on the same or a different mass of a suspended spring-mass system of a gyroscope) and orientation (e.g., direction in which the external signal can be applied) of the drive components applying the external signal, the external signal may be applied in a variety of different manners to cause a change in a quadrature component of the sensed signal that corresponds to the applied external signal (e.g., causing a proportional increase in the quadrature component of the sensed signal, for determination of phase error).

In some embodiments, the external signal may be applied as a DC signal that results in a change (e.g., a proportional increase) in the quadrature component of the sensed signal. For example, quadrature tuning electrodes may be located at a suitable location relative to driven masses of a suspended spring-mass system (e.g., of a gyroscope) such that a DC signal applied to the quadrature tuning electrodes imparts a force on the driven masses that corresponds to the phase of the quadrature component of the sensed signal, i.e., based on a change in overlap between the driven masses and the quadrature tuning electrodes. The external signal applied to the quadrature tuning electrodes may cause a change in a quadrature component of the sensed signal that corresponds to the applied external signal (e.g., causing a proportional increase in the quadrature component of the sensed signal, for determination of phase error).

The phase error may be determined at a variety of times and in a variety of manners, and compensation may be performed as described herein. In some embodiments, a phase error may be determined during a manufacturing, testing, and/or calibration process by applying an external signal to modify a quadrature component of the sensed signal and/or applying an external rate to modify an in-phase component of the sensed signal. In some embodiments, the applied external signal and/or rate may be applied in an iterative manner to determine phase error and test the accuracy of compensation techniques. For example, an initial estimate of phase error may be determined, a compensation technique may be applied to the MEMS device, and then a known rate of rotation may be applied to test the accuracy of the output of the sensor (e.g., angular velocity or an output determined from angular velocity). This process may be repeated until the output of the sensor is within a suitable threshold of a desired output.

In some embodiments, a phase error may be determined during the active operational life of the MEMS device. The external signal may be applied at suitable times, for example, during device startup, a periodic calibration routine, or when the sensed parameter (e.g., angular velocity) has been less than a threshold for a predetermined period of time. By applying the external signal at suitable times during the operational life of the MEMS device, phase drift over the life of the sensor may be identified and compensation and/or modification of sensor operation (e.g., modification of drive signals, scaling factors, etc.) may be performed to increase the accuracy and operational life of the MEMS device.

Figure 1A:
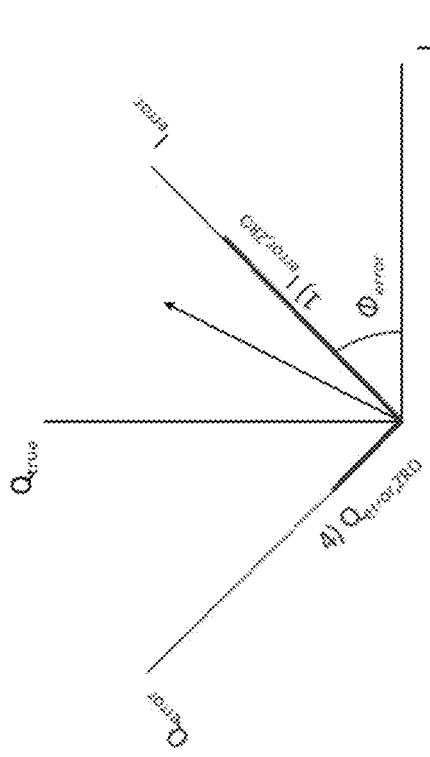
Figure 1C:
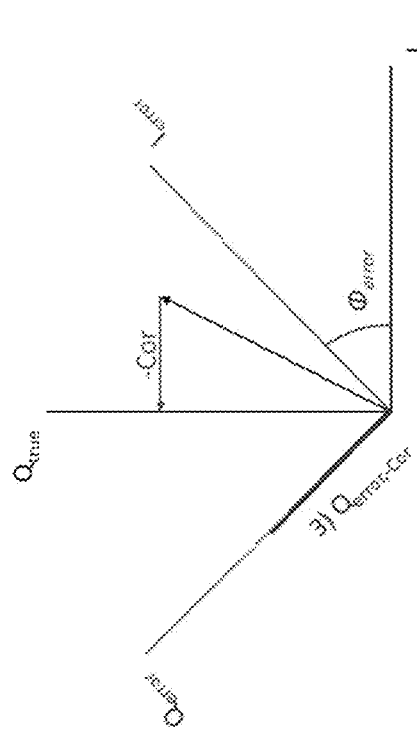

Referring now to FIGS. 1A-1C, orientation of Coriolis vector in phase domain for calculating a phase error in accordance with some embodiments is shown. According to some embodiments, the orientation of the Coriolis vector in the phase domain may be determined using a rate table characterization. It is appreciated that aligning the sense mode demodulation phase to the Coriolis vector, e.g., by changing the demodulation phase, may improve the performance of the gyroscope. Thus, the demodulation phase angle of the gyroscope can be trimmed to Coriolis signal, improving the performance of the gyroscope.

FIG. 1A shows the in-phase and the quadrature components of a gyroscope. It is appreciated that the true in-phase and the true quadrature components may be unknown. As such, the phase error, for example resulting from package stress, may also be unknown. It is appreciated that the in-phase error and the quadrature error components may be $$\begin{bmatrix} I_{error} \\ Q_{error} \end{bmatrix} = \begin{bmatrix} \cos(\phi_{error}) & \sin(\phi_{error}) \\ -\sin(\phi_{error}) & \cos(\phi_{error}) \end{bmatrix} \begin{bmatrix} I_{true} \\ Q_{true} \end{bmatrix}. \tag{1}$$

It is, however, appreciated that the in-phase component at zero rate output may be measured, as depicted as $I_{error,ZRO}$ in FIG. 1A. Similarly, the quadrature component at zero output may be measured, as depicted as $Q_{error,ZRO}$ in FIG. 1A. It is appreciated that the in-phase error and the quadrature error components for zero rate output may be measured and it may be $$\begin{bmatrix} I_{error,ZRO} \\ Q_{error,ZRO} \end{bmatrix} = \begin{bmatrix} \cos(\phi_{error}) & \sin(\phi_{error}) \\ -\sin(\phi_{error}) & \cos(\phi_{error}) \end{bmatrix} \begin{bmatrix} I_{true} \\ Q_{true} \end{bmatrix}. \tag{2}$$

It is appreciated that the in-phase component at a rate input may be measured, as depicted as $I_{error,+Cor}$ in FIG. 1B. Similarly, the quadrature component at a rate input may be measured, as depicted as $Q_{error,+Cor}$ in FIG. 1B. It is appreciated that the in-phase error and the quadrature error components for the rate input may be measured and it may be $$\begin{bmatrix} I_{error,+Cor} \\ Q_{error,+Cor} \end{bmatrix} = \begin{bmatrix} \cos(\phi_{error}) & \sin(\phi_{error}) \\ -\sin(\phi_{error}) & \cos(\phi_{error}) \end{bmatrix} \begin{bmatrix} I_{true+Cor} \\ Q_{true} \end{bmatrix}. \tag{3}$$

It is further appreciated that the in-phase component at another rate input may be measured, as depicted as $I_{error,-Cor}$ in FIG. 1C. Similarly, the quadrature component at another rate input may be measured, as depicted as $Q_{error,-Cor}$ in FIG. 1C. It is appreciated that the in-phase error and the quadrature error components for another rate input may be measured and it may be $$\begin{bmatrix} I_{error,-Cor} \\ Q_{error,-Cor} \end{bmatrix} = \begin{bmatrix} \cos(\phi_{error}) & \sin(\phi_{error}) \\ -\sin(\phi_{error}) & \cos(\phi_{error}) \end{bmatrix} \begin{bmatrix} I_{true-Cor} \\ Q_{true} \end{bmatrix}. \tag{4}$$

Accordingly, the phase error may be determined.

$$\phi_{error} = \arctan(B, A) \tag{5}$$

where $A = I_{error,+Cor} - I_{error,ZRO} = \text{Cor} \cos(\phi_{error})$ (6)

and $$B = Q_{error,ZRO} - Q_{error,-Cor} = \text{Cor} \sin(\phi_{error}). \tag{7}$$

In other words, the phase error that has been determined may be used to trim and align the phase of the gyroscope, e.g., by modifying the phase of the demodulator or changing the phase of the clock, to the Coriolis vector. It is appreciated that the sensitivity of the gyroscope may also be determined using the quadrature difference and the in-phase difference $$|Cor|=\sqrt{A^2+B^2}, \tag{8}$$

Figure 2:
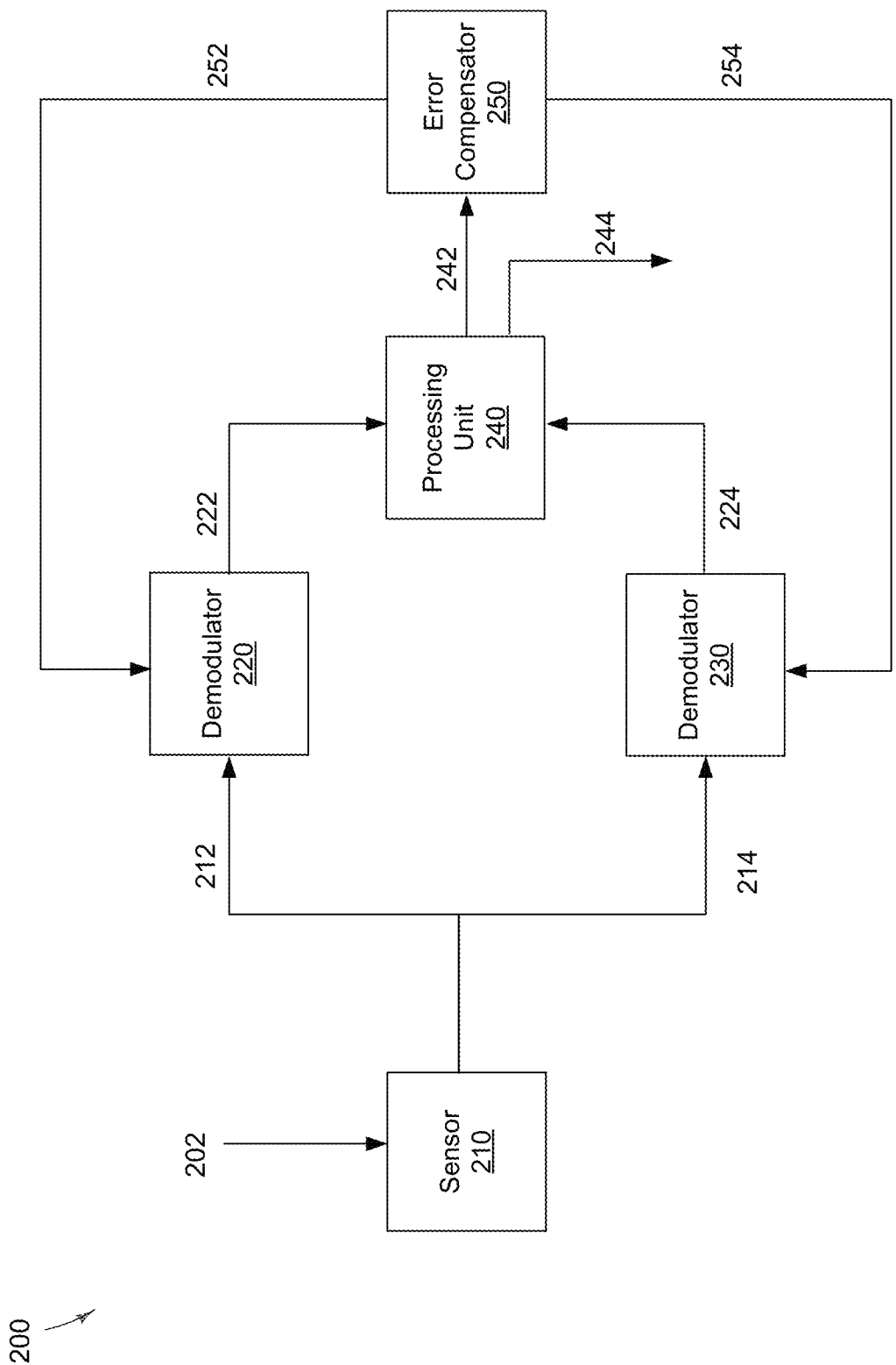
FIG. 2 shows a system for determining a phase error and for compensating the phase error in accordance with some embodiments of the present disclosure.

Referring now to FIG. 2, a system for determining a phase error and for compensating the phase error in accordance with some embodiments is shown. It is appreciated that FIG. 2 depicts an embodiment for implementing the determination of the phase error, for example due to package stress, determination of the sensitivity of the gyroscope as well as compensating for the determined error in order to improve performance of the gyroscope.

System 200 includes a sensor 210, e.g., a gyroscope, demodulators 220 and 230, a processing unit 240, and an error compensator 250. The sensor 210 may be a gyroscope, a magnetometer, etc., and it may include various components such as a piezo element. The sensor 210 receives an input signal, e.g., zero rate output according to FIG. 1A, a rate input according to FIGS. 1B and 1C or an input signal resulting from movements, rotation, electrostatic force, a magnetic force, etc.

The sensor 210 may then output signal 212 to the demodulator 220 and it may output signal 214 to the demodulator 230. The output signal from the sensor 210 may be the sensed signal due to zero rate output or other rate inputs. It is appreciated that according to some embodiments the two separate paths are configured to detect the in-phase and the quadrature components. For example, signal 212 input to the demodulator 220 may identify the in-phase component whereas signal 214 input to the demodulator 230 may identify the quadrature component of the signal.

According to some embodiments, the demodulator 220 may output the in-phase component 222 to the processing unit 240 and the demodulator 230 may output the quadrature component 224 to the processing unit 240. It is appreciated that the in-phase and the quadrature components may include the zero rate output, and two rate inputs as discussed with respect to FIGS. 1A-1C. It is appreciated that the processing unit 240 may be configured to determine the phase error based on the received signals from the demodulators 220 and 230 and according to equations (1)-(8). It is appreciated that a change in rotation may cause a change in the rate input. In some embodiments, the change in rotation may be achieved using one or more actuators. It is appreciated that according to some embodiments, the actuator may be configured to periodically change the rotation rate. Accordingly, the phase error may be periodically estimated and corrected.

It is further appreciated that the sensitivity of the sensor 210 may also be determined by the processing unit 240. The processing unit 240 may output the readings 244 and 242. Output signals 244 may be used as the output reading of the device.

Signal 242 may be input to the error compensator 250. Signal 242 may be the phase error that has been determined by the processing unit 240 and according to equations (1)-(8) above. The error compensator 250 may be configured to use the determined phase error to modify the operation of the demodulators 220 and 230 respectively to adjust for the determined error. For example, the error compensator 250 may transmit a signal 252 to the demodulator 220 in order to modify the operation of the demodulator 220 in order to compensate for the determined error associated with the in-phase component. Similarly, the error compensator 250 may transmit a signal 254 to the demodulator 230 in order to modify the operation of the demodulator 230 in order to compensate for the determined error associated with the quadrature component.

It is appreciated that in some embodiments, the processing unit 240 may be configured to trigger a phase error calculation in response to a change in the rate signal or a quadrature component. For example, a first in-phase and quadrature components (e.g., at zero rate) may be determined before application of the change in the rate signal (e.g., through an actuator) or the quadrature component (e.g., by application of the external signal, as described herein). The in-phase and the quadrature components associated with the change in rate signal or the quadrature component may be determined after the rate signal or external signal is changed, e.g., by using an actuator or applying the external signal.

It is appreciated that the processing unit 240 may be triggered to calculate phase errors in response to a difference between the first and second rate signals or first and second quadrature components (e.g., difference between the zero rate and change in the rate signal, or difference between no external signal applied and an applied external signal that increases the quadrature component) exceeding a threshold. In some embodiments, the processing unit 240 may be triggered to calculate phase errors in response to a difference between the first and second in-phase components or first and second quadrature components exceeding a threshold. The first and the second in-phase components may be components associated with two different rate signals, e.g., zero rate and a changed rate for instance. The first and the second quadrature components may be components associated with two different external signals, e.g., zero magnitude external signal and a changed external signal for instance. It is appreciated that according to some embodiments, the processing unit 240 may be triggered to calculate phase errors in response to a difference between the first and second quadrature components exceeding a threshold. The first and the second quadrature components may be components associated with two different rate signals, e.g., zero rate and a changed rate for instance, or in some embodiments, changes in an applied external signal. It is appreciated that the processing unit 240 may be triggered to calculate phase errors in response to a difference between the first and second sensed signal exceeding a threshold. It is appreciated that the first and the second sensed signals may be output signals of the sensor 210 in response to various rate inputs or external signal inputs, e.g., at zero rate and at a changed rate or a change in an applied external signal. According to some embodiments, the zero rate may be associated with no motion and a changed rate may be associated with a constant rate, a transient rate or a rotation.

According to some embodiments, the phase error correction may be applied, e.g., by the error compensator 250, in response to a change in rotation rate or the applied external signal, e.g., zero rate and a changed rate or an increase in an applied external signal. In some embodiments, the change in rate signal may be a difference in average rates over a period of time.

Figure 3:
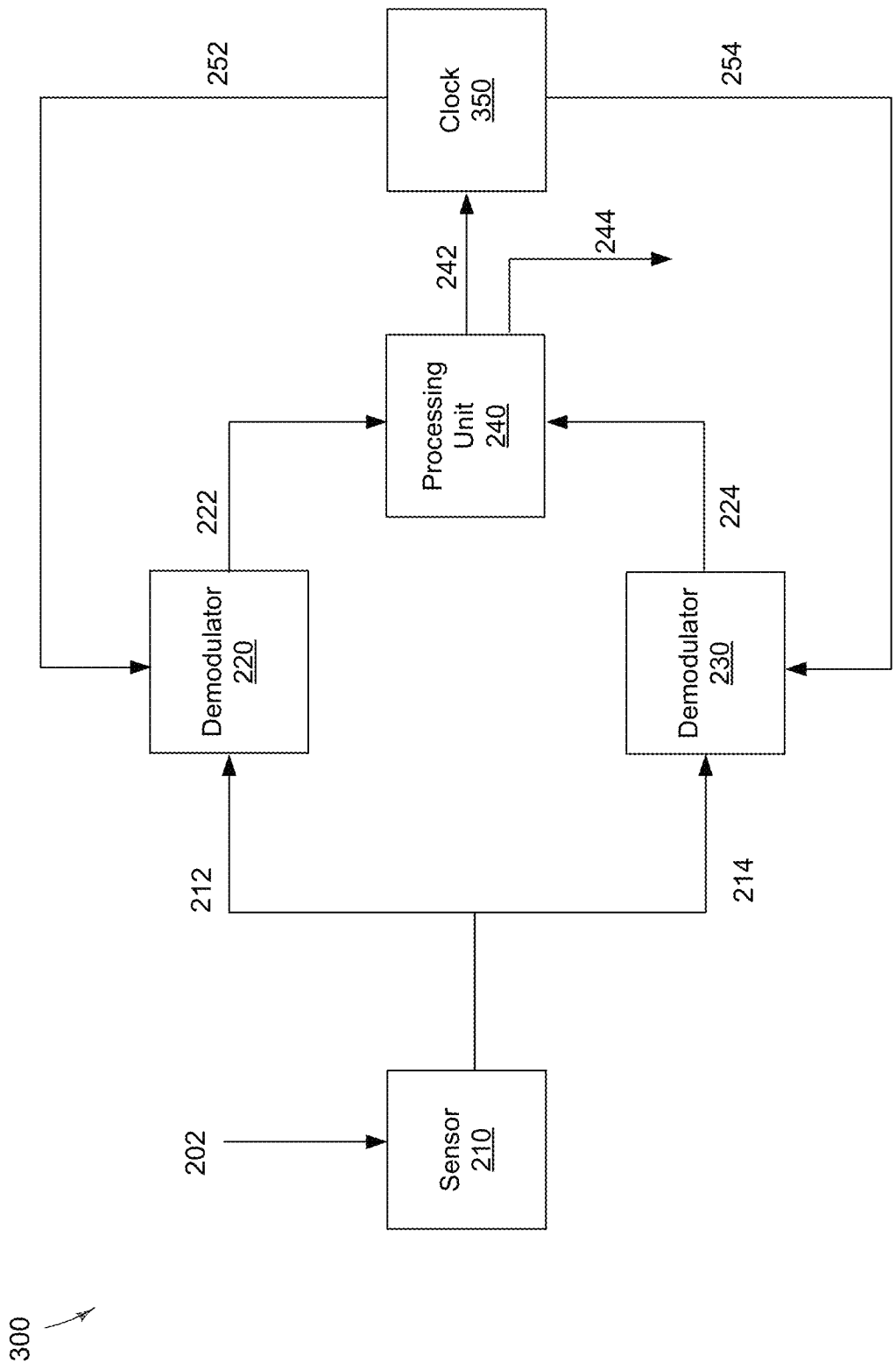
FIG. 3 shows another system for determining a phase error and for compensating the phase error in accordance with some embodiments of the present disclosure.

Referring now to FIG. 3, another system for determining a phase error and for compensating the phase error in accordance with some embodiments is shown. System 300 is substantially similar to that of FIG. 2. However, the error compensator 250 is replaced with a clock 350 component. The clock 350 may receive the determined phase error and it may adjust the phase of the clocking signal for the demodulators 220 and 230. As such, the demodulators 220 and 230 may be aligned with the Coriolis signal and quadrature signal respectively.

Figure 4:
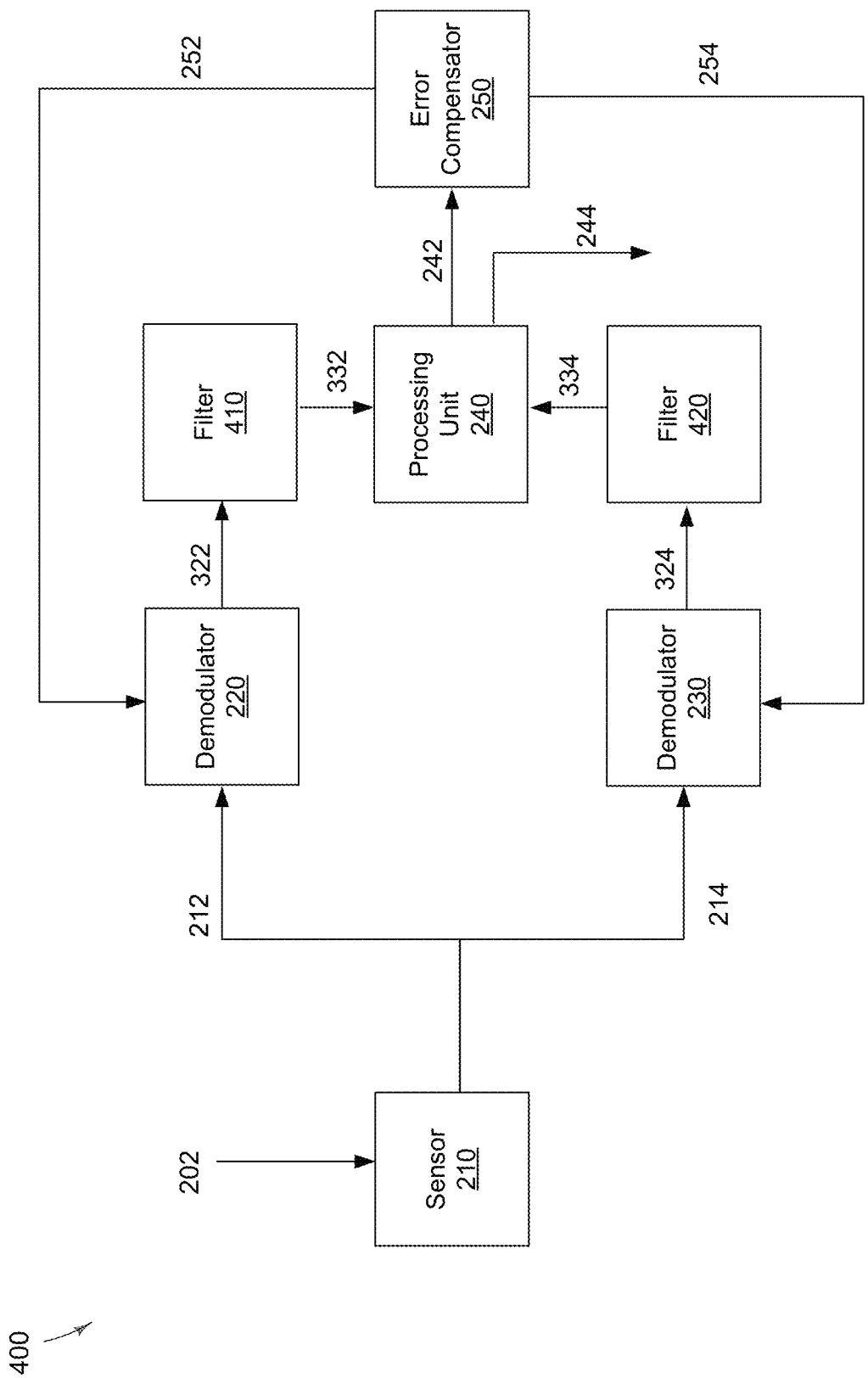
FIG. 4 shows one system for determining a phase error and for compensating the phase error in accordance with some embodiments of the present disclosure.

Referring now to FIG. 4, one system for determining a phase error and for compensating the phase error in accordance with some embodiments is shown. The system 400 is substantially similar to that of FIG. 2 except that filters 410 and 420 associated with the demodulators 220 and 230 respectively are used to average the signals before transmission to the processing unit 240. It is appreciated that the filters 410 and 420 may be a low pass filter, integrator, a bandpass filter, or any combination thereof.

It is appreciated that FIG. 2-4 depict embodiments where the in-phase and the quadrature components can be determined simultaneously because of different paths, one for the in-phase path and another for the quadrature path. It is also appreciated that the determination of the phase error, the sensitivity, and the compensation for the error may occur at a manufacturing site where the error is compensated for or it may alternatively occur dynamically during use and in response to detecting a motion, e.g., movement, rotation, etc. For example, the phase error determination may occur in response to detecting a movement, a rotation, etc., and the phase error may be corrected and compensated for resulting therefrom. It is also appreciated that the phase error determination may occur periodically (e.g., predetermined periods), such as once every hour, once a day, once a month, etc., in order to calibrate the device.

Figure 5:
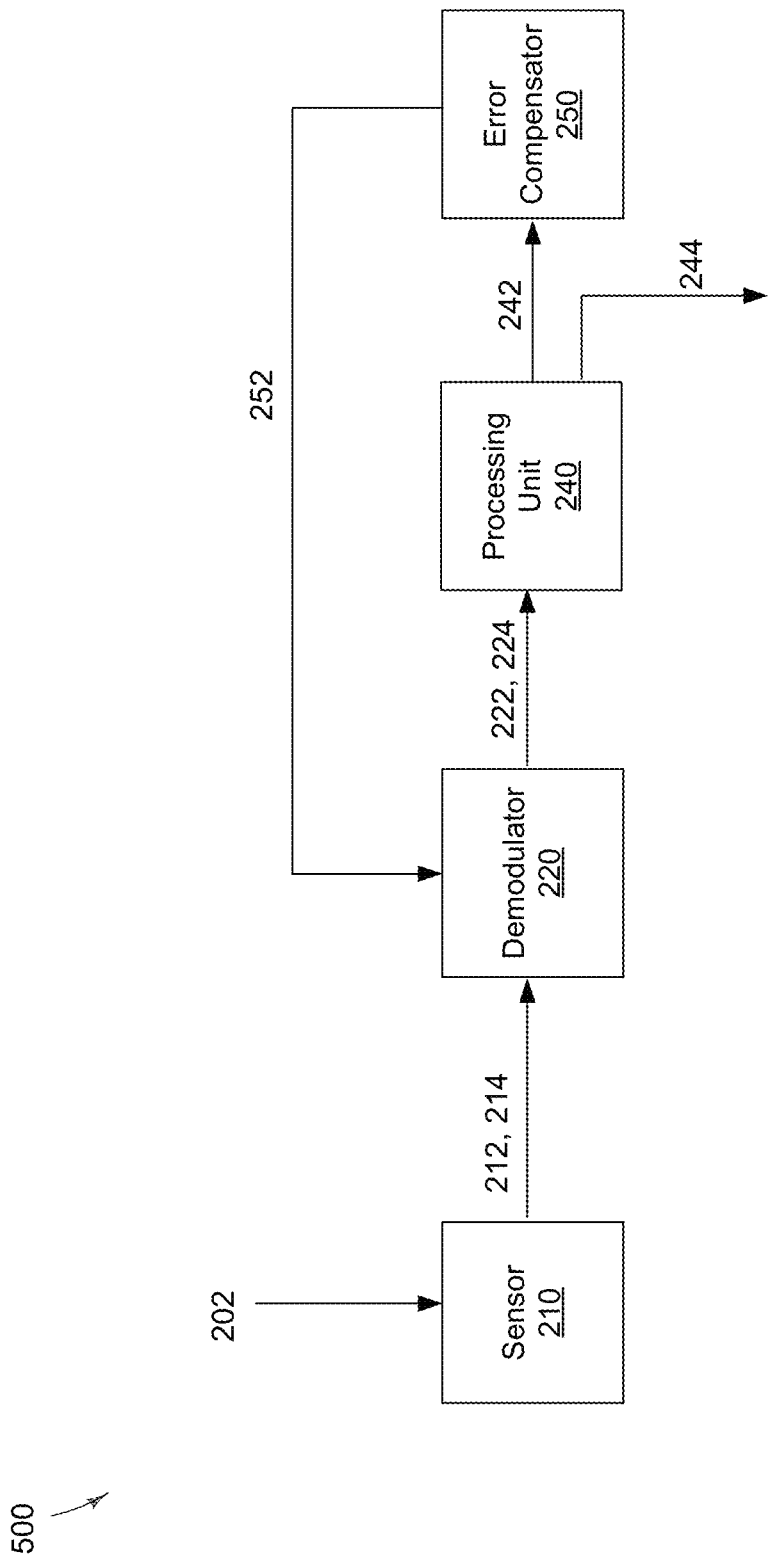
FIG. 5 shows a single demodulator system for determining a phase error and for compensating the phase error in accordance with some embodiments of the present disclosure.

Referring now to FIG. 5, a single demodulator system for determining a phase error and for compensating the phase error in accordance with some embodiments is shown. FIG. 5 is similar to that of FIG. 2 except that in this embodiment the in-phase component and the quadrature component are determined using the same path and therefore the same components. In other words, the in-phase components, e.g., zero rate output, rate inputs, external signals, etc., may occur in sequence with respect to one another and further with respect to the quadrature components for zero rate output, rate inputs, etc. In other words, the system 500 determines the in-phase components for the zero rate out, and the rate inputs sequentially. Similarly, the system 500 determines the quadrature components for the zero rate out, and the rate inputs sequentially. The processing unit 240 may use the in-phase components and the quadrature components that have been received sequentially to determine the phase error. The error compensator 250 may use the determined phase error in order to compensate for the error similar to that of FIG. 2.

Figure 6:
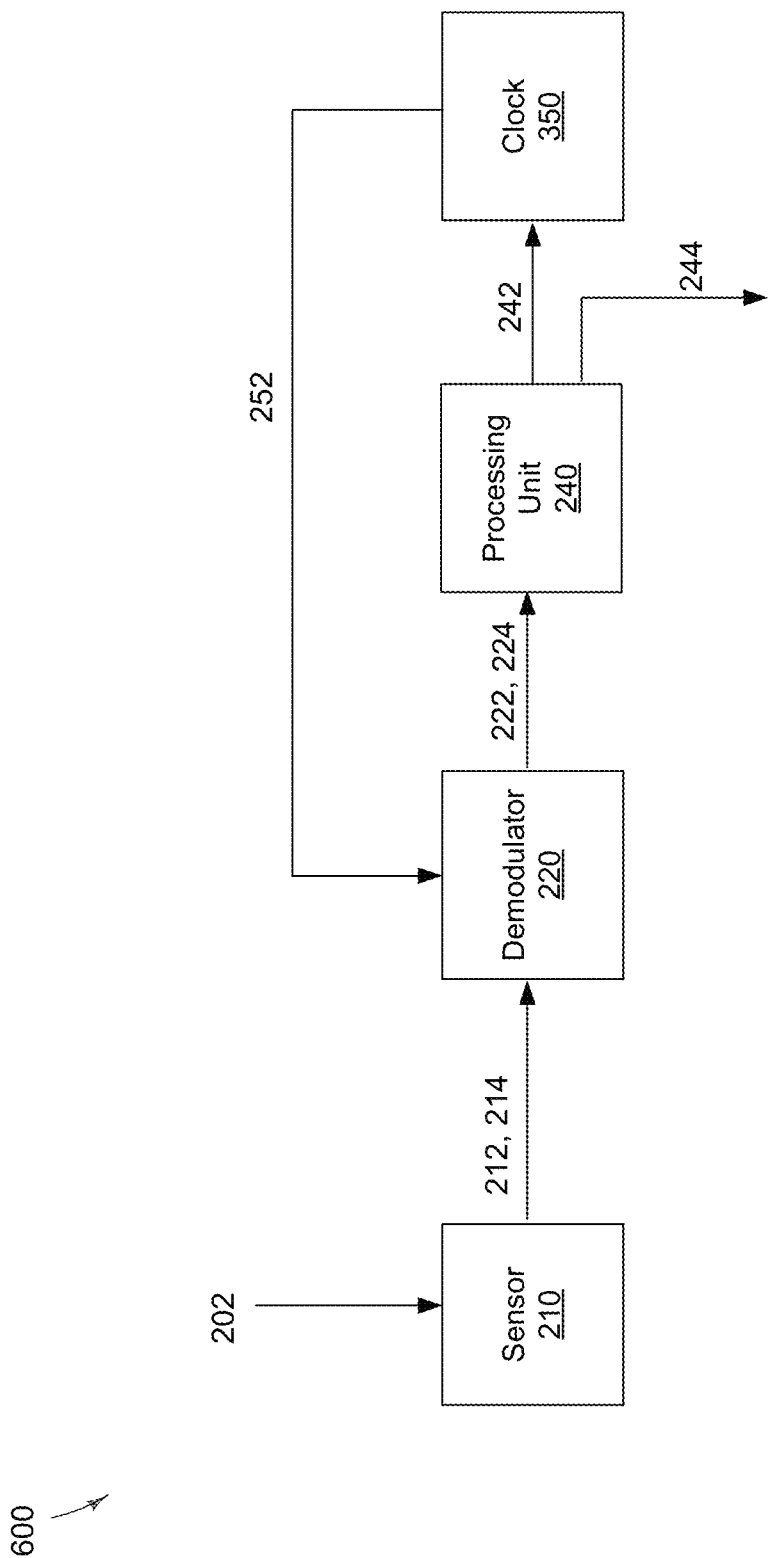
FIG. 6 shows another single demodulator system for determining a phase error and for compensating the phase error in accordance with some embodiments of the present disclosure.

Referring now to FIG. 6, another single demodulator system for determining a phase error and for compensating the phase error in accordance with some embodiments is shown. FIG. 6 operates substantially similar to that of FIG. 5 except that the error compensator 250 has been replaced by the clock 350 where it operates similar to that of FIG. 3.

Figure 7:
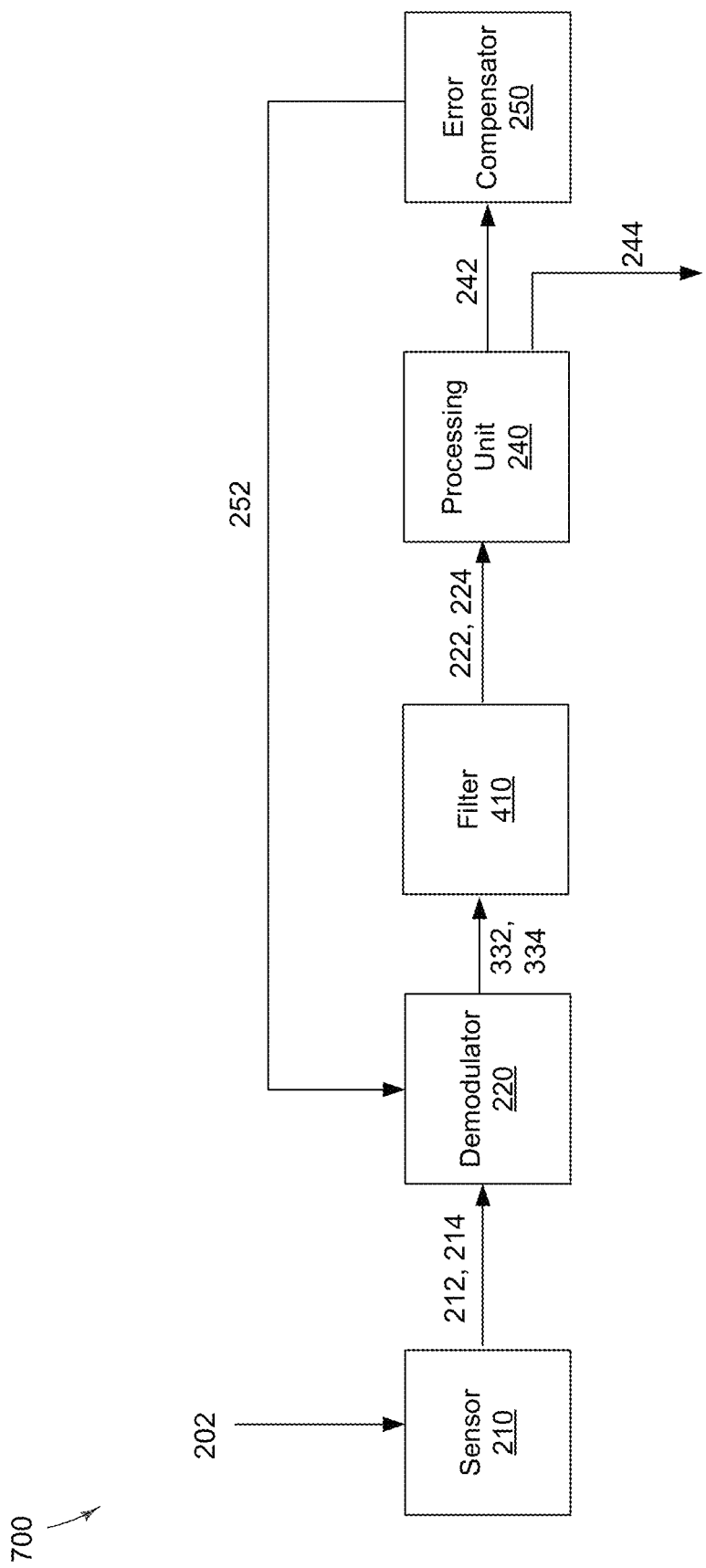
FIG. 7 shows yet another single demodulator system for determining a phase error and for compensating the phase error in accordance with some embodiments of the present disclosure.

Referring now to FIG. 7, yet another single demodulator system for determining a phase error and for compensating the phase error in accordance with some embodiments is shown. FIG. 7 operates substantially similar to that of FIG. 5 except that the filter 410 is introduced in order to average the signals being transmitted to the processing unit 240. The operation of the filter 410 is similar to that described in FIG. 4.

It is appreciated that FIGS. 5-7 depict embodiments where the in-phase and the quadrature components are determined sequentially by sharing the same path for the in-phase path and the quadrature component. It is also appreciated that the determination of the phase error, the sensitivity, and the compensation for the error may occur at a manufacturing site where the error is compensated for or it may alternatively occur dynamically during use and in response to detecting a motion, e.g., movement, rotation, etc. For example, the phase error determination may occur in response to detecting a movement, a rotation, etc., and the phase error may be corrected and compensated for resulting therefrom. It is also appreciated that the phase error determination may occur periodically (e.g., predetermined periods), such as once every hour, once a day, once a month, etc. in order to calibrate the device.

Figure 8:
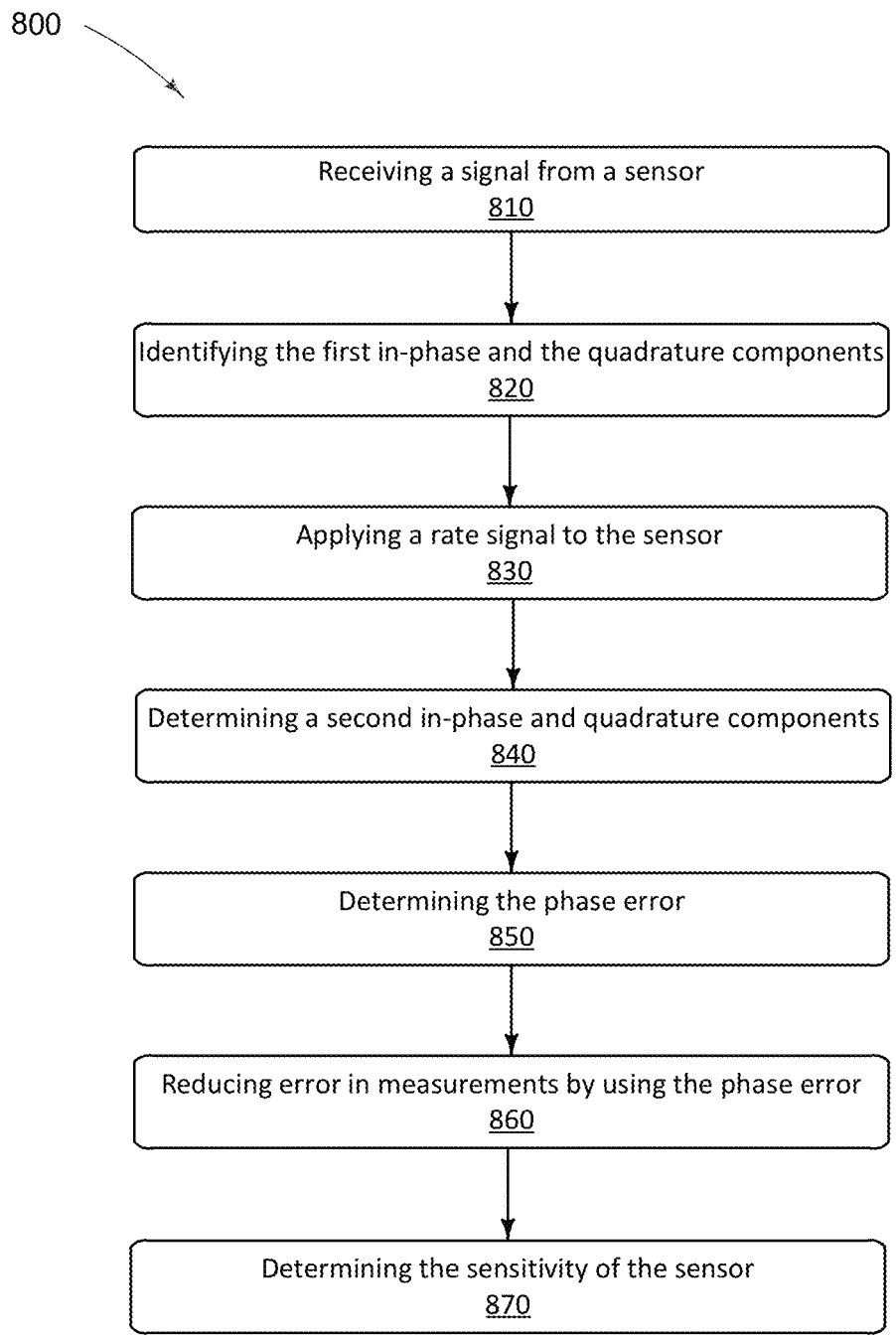
FIG. 8 shows a flow diagram for determining a phase error and for compensating for the phase error in accordance with some embodiments of the present disclosure.

Referring now to FIG. 8, a flow diagram 800 for determining a phase error and for compensating for the phase error in accordance with some embodiments is shown. At step 810, a signal e.g., zero rate output, is received from the sensor, e.g., MEMS, gyroscope, etc., as discussed above with respect to FIGS. 1A-7. At step 820, the first in-phase and the first quadrature components may be identified, e.g., by using one or more modulators as described above with respect to FIGS. 1A-7. It is appreciated that the first in-phase and the first quadrature components may be determined sequentially using the same demodulator or simultaneously through independent modulators as described above.

At step 830, a rate signal, e.g., magnetic force, electrostatic force, rotation, movement, etc., is applied to the sensor. Accordingly, the sensor generates a sensed signal. At step 840, the second in-phase and the second quadrature components associated with the sensed signal may be identified, e.g., by using one or more modulators as described above with respect to FIGS. 1A-7. It is appreciated that the first in-phase and the first quadrature components may be determined sequentially using the same demodulator or simultaneously through independent modulators as described above.

At step 850, the phase error may be determined based on the first in-phase and quadrature components and further based on the second in-phase and quadrature components. For example, in some embodiments, the phase error may be determined based on a difference between the quadrature components (e.g., zero rate output and the rate signal) and further based on a difference between the in-phase components (e.g., zero rate output and the rate signal). In some embodiments, the phase error may be an arctangent of the two differences. It is appreciated that in some embodiments, the phase error may be the ratio of the two differences.

It is appreciated that the determination of the phase error may occur periodically, in response to detecting a motion, or during the manufacturing process in order to calibrate the device, or any combination thereof. For example, the in-phase and the quadrature components may be periodically identified and determined in response to detecting a motion or in response to application of another rate signal. A new phase error may therefore be calculated periodically or the old phase error may be updated.

At step 860, the error may be reduced by using the determined phase error in order to control the operation of the demodulator(s), as described in FIGS. 1A-7, in order to dynamically compensate for the determined error. For example, the clock signal used for the demodulator(s) may be modified based on the determined phase error, thereby changing the demodulation phase of the in-phase and the quadrature components.

It is appreciated that in some embodiments the same or a different rate signal may be applied to the sensor periodically and the process may be repeated in order to recalculate the phase error. As such, the device may be recalibrated periodically. It is appreciated that in one optional embodiment, at step 870, the sensitivity of the sensor may be calculated and determined based on the quadrature difference and the in-phase difference. For example, the sensitivity may be based on equation (9) above.

Figure 9:
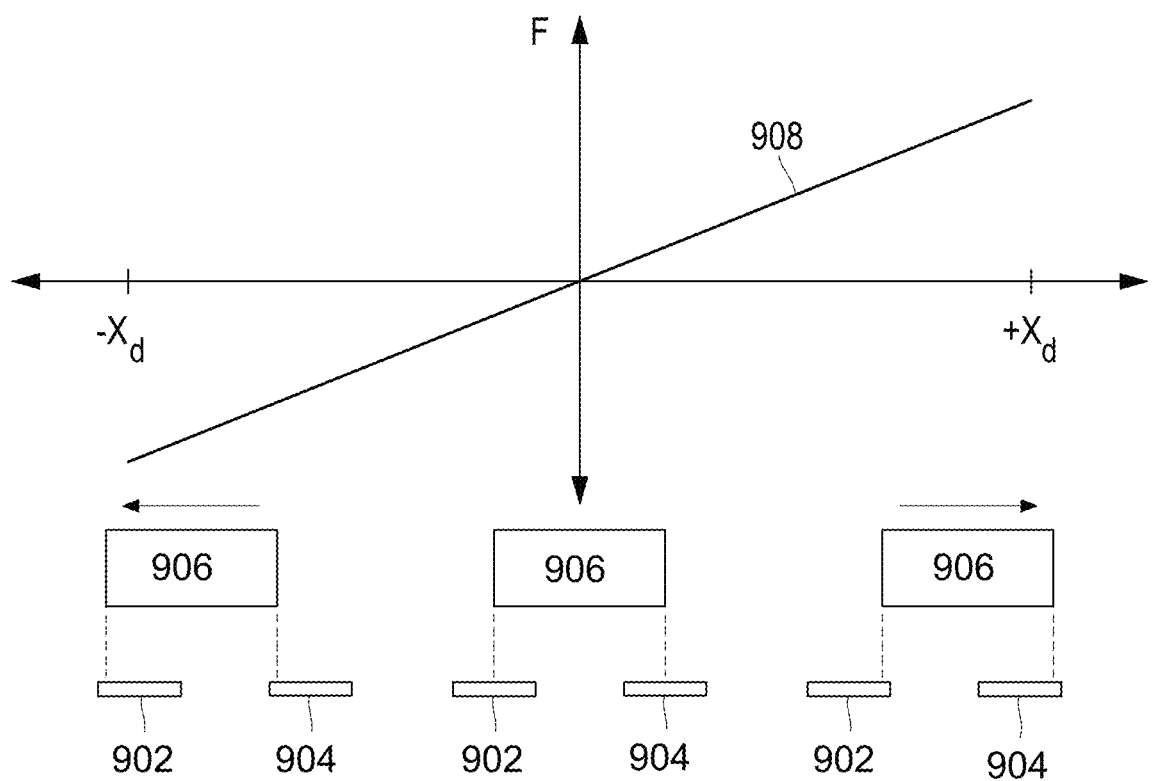
FIG. 9 shows an illustrative MEMS sensor including quadrature tuning electrodes in accordance with some embodiments of the present disclosure.

FIG. 9 shows an illustrative MEMS sensor including quadrature tuning electrodes in accordance with some embodiments of the present disclosure. In the exemplary embodiment depicted in FIG. 9, a proof mass 906 is depicted relative to a plurality of quadrature tuning electrodes 902 and 904. In the simplified representation depicted in FIG. 10, a single proof mass 906 is depicted occupying a first plane (e.g., within a MEMS layer of a MEMS device) and the quadrature tuning electrodes 902 and 904 are located below the proof mass (e.g., on a substrate of a CMOS layer of the MEMS device) on a plane that is parallel to the lower surface of the proof mass 906. However, it will be understood that a variety of numbers, sizes, shapes, and relative locations of proof masses and quadrature tuning electrodes may be implemented in accordance with the present disclosure.

In the exemplary embodiment of FIG. 9, the proof mass 906 and quadrature tuning electrodes 902 and 904 are depicted at three different relative locations with respect to each other, with plot 908 depicting a force experienced by the proof mass 906 at those three locations and other points between. The proof mass 906 may be caused to move as a result of a drive motion imparted on a suspended spring-mass system associated with the proof mass, oscillating within the MEMS plane along a drive axis (e.g., the x-axis) at a drive frequency. In an embodiment of a MEMS gyroscope, a rotation about an axis perpendicular to the drive axis may result in a Coriolis force perpendicular to the drive axis and the axis of rotation, and may be sensed as described herein and as will be understood by a person of skill in the art, for example, by in-plane or out-of-plane sense electrodes along a sense axis associated with the Coriolis force.

DC signals may be applied to the respective quadrature tuning electrodes 902 and 904 to impart a force on the proof mass 906 (e.g., based on a capacitance between the quadrature tuning electrodes and the proof mass). In the embodiment of FIG. 9 quadrature tuning electrode 904 may have a positive voltage applied thereto while quadrature tuning electrode 902 may have a negative voltage applied thereto. When the proof mass 906 is stationary or located at a center point of its oscillation along the x-axis, as depicted by the middle representation of proof mass 906 and quadrature tuning electrodes 902 and 904, the overlap between the proof mass 906 and the quadrature tuning electrodes 902 and 904 may be equal, such that no force is imparted on the proof mass by the quadrature tuning electrodes. When the proof mass 906 is oscillated in the positive x-axis direction, as depicted by the right-side representation of proof mass 906 and quadrature tuning electrodes 902 and 904, the overlap between the proof mass 906 and the quadrature tuning electrode 902 is minimized, while the overlap between the proof mass 906 and the quadrature tuning electrode 904 is maximized. As a result of the positive DC voltage applied to quadrature tuning electrode 904, proof mass 906 experiences a force that causes it to move in the positive z-direction, which can be sensed by sense electrodes and which corresponds to a quadrature component of the sensed signal. When the proof mass 906 is oscillated in the negative x-axis direction, as depicted by the left-side representation of proof mass 906 and quadrature tuning electrodes 902 and 904, the overlap between the proof mass 906 and the quadrature tuning electrode 904 is minimized, while the overlap between the proof mass 906 and the quadrature tuning electrode 902 is maximized. As a result of the negative DC voltage applied to quadrature tuning electrode 902, proof mass 906 experiences a force that causes it to move in the negative z-direction, which can be sensed by sense electrodes and which corresponds to a quadrature component of the sensed signal.

Figure 10:
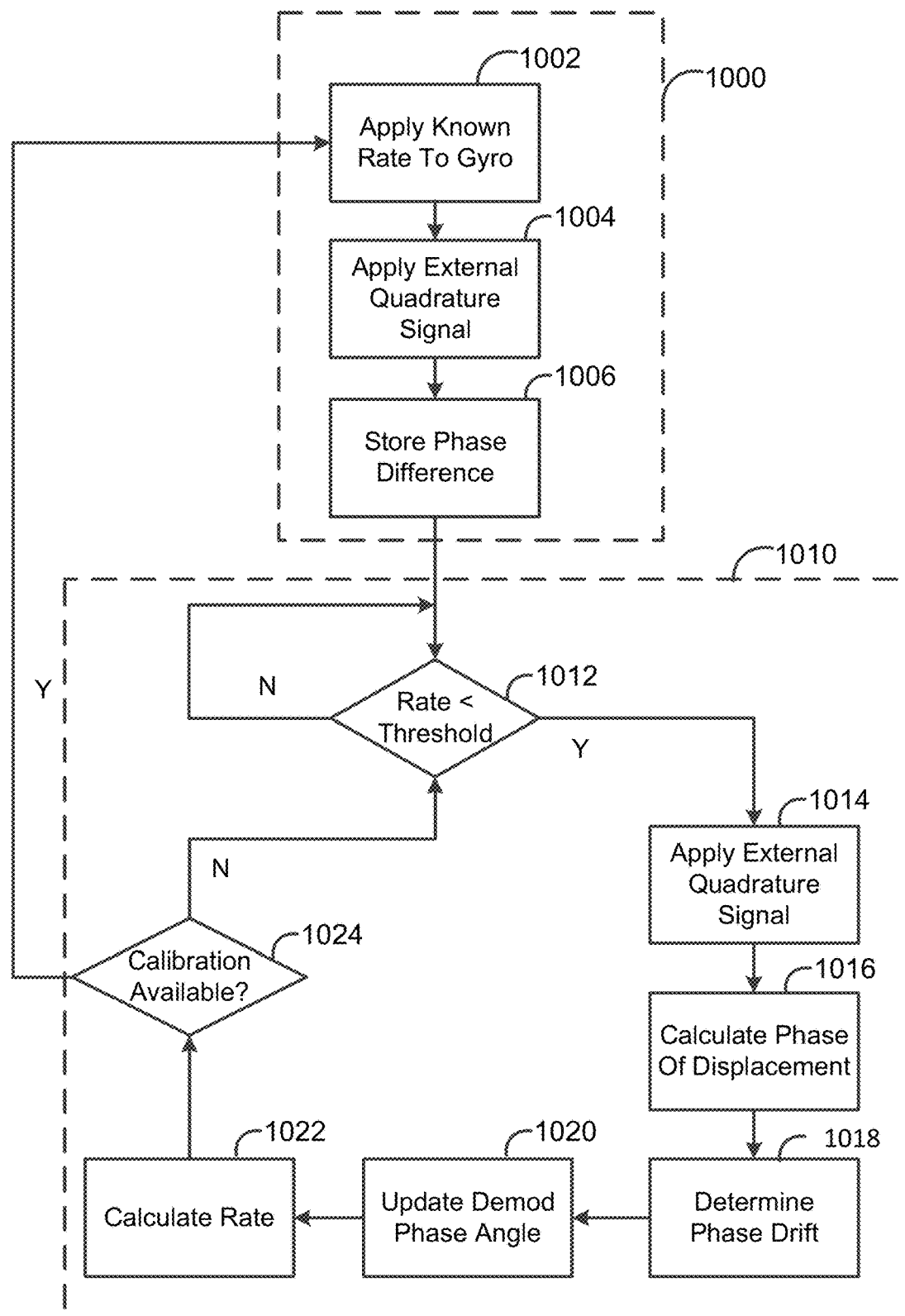
FIG. 10 shows a flow diagram for determining a phase error based on an applied quadrature drive signal in accordance with some embodiments of the present disclosure.
Figure 11:
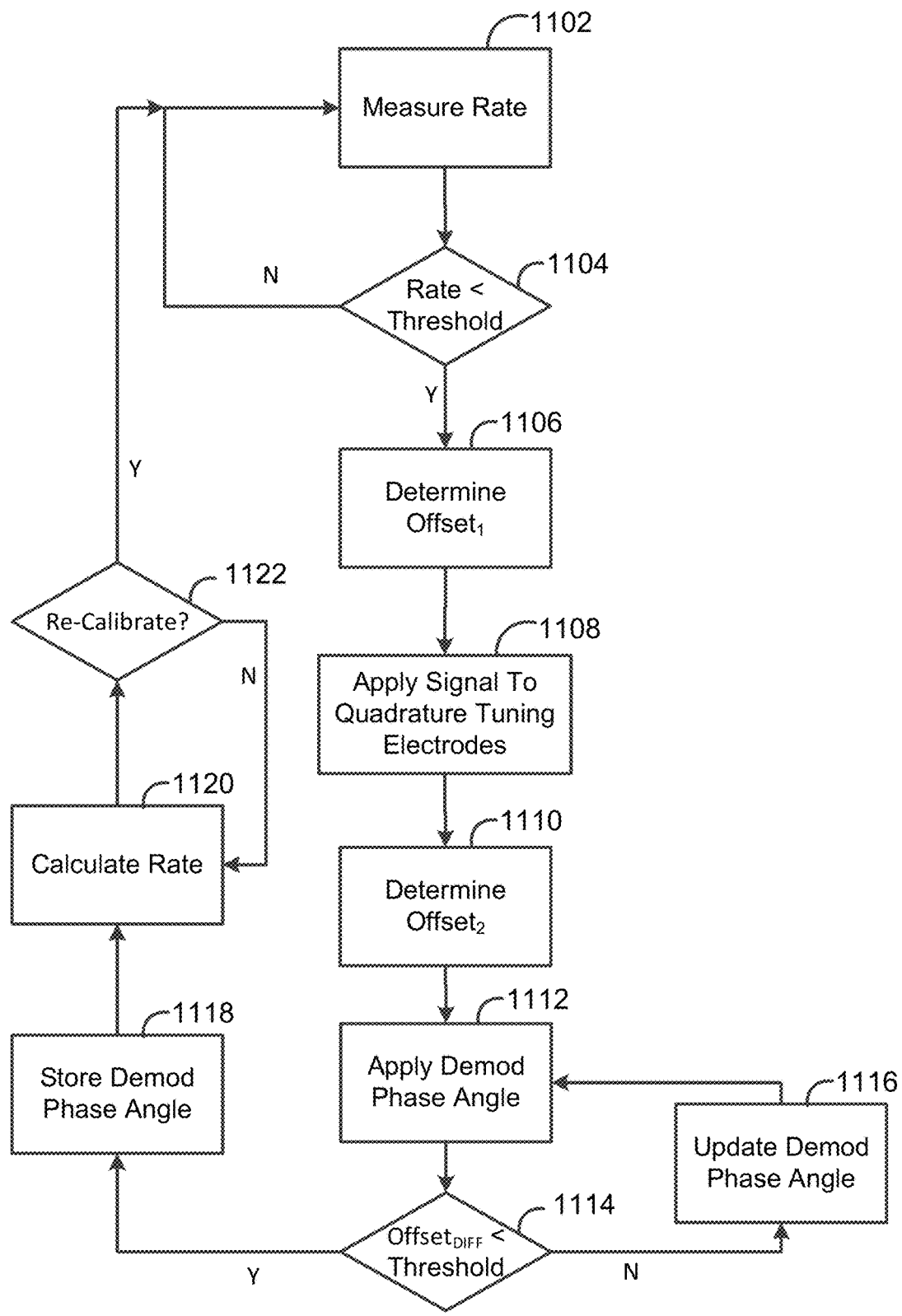
FIG. 11 shows a flow diagram for determining a phase error based on an applied signal from a quadrature tuning signal in accordance with some embodiments of the present disclosure.
Figure 12:
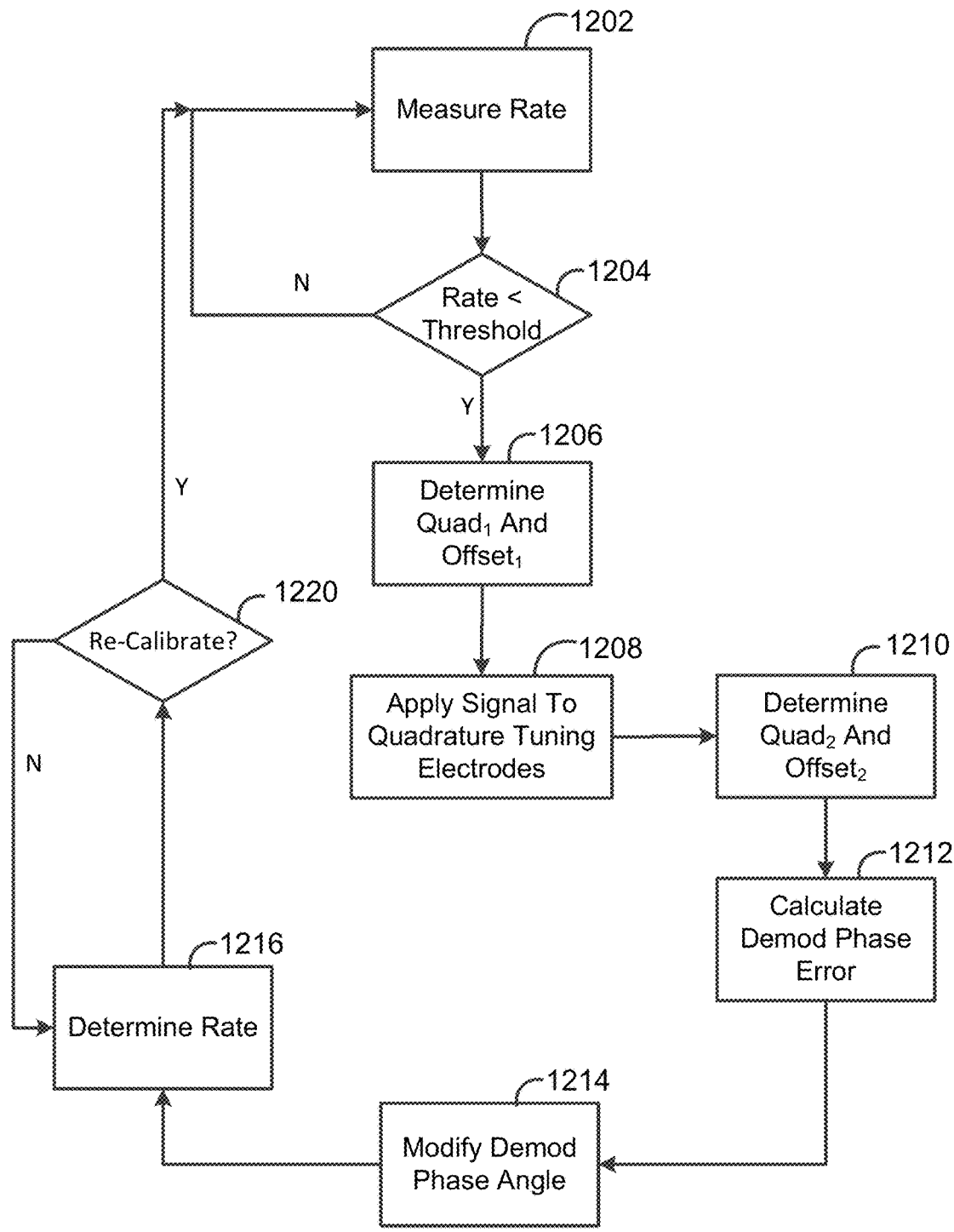
FIG. 12 shows a flow diagram for determining a phase error based on an applied signal from a quadrature tuning signal in accordance with some embodiments of the present disclosure.

FIGS. 10-12 depict exemplary steps for identifying and compensating for a phase error according to some embodiments of the present disclosure. Although FIGS. 10-12 are described in the context of the present disclosure, it will be understood that the methods and steps described in FIGS. 10-12 may be applied to a variety of sensor and gyroscope designs, and to methodologies for applying a signal that modifies a quadrature component of a sensed signal in a predictable manner. Although a particular order and flow of steps is depicted in FIGS. 10-12, it will be understood that in some embodiments one or more of the steps may be modified, moved, removed, or added, and that the flow depicted in FIGS. 10-12 may be modified. Although FIGS. 10-12 may be described in the context of a MEMS gyroscope, it will be understood that the disclosure of FIGS. 10-12 may be applied to other sensor types.

FIG. 10 shows a flow diagram for determining a phase error based on an applied quadrature drive signal in accordance with some embodiments of the present disclosure. FIG. 10 depicts two exemplary phases of operation, a calibration stage 1000 and an operations stage 1010. The calibration stage 1000 may determine an initial baseline of values for determining phase error, for example, by applying a known rate to a MEMS gyroscope. The calibration stage 1000 may occur under controlled conditions, such as during manufacturing, testing, service, or in-field calibration procedures where an applied rate of rotation can be provided with reasonable certainty. During the operations stage 1010, the external signal may be applied at appropriate times, such as during startup or when a measured rate of rotation is less than a threshold. The external signal may modify the quadrature component of the received signal in a predictable manner, based at least in part on known characteristics of the sensor from the calibration stage 1000. Thus, operations stage 1010 may allow the phase error for the sensor to be measured during the life of the sensor, thus providing more accurate measurement of rate of rotation over the life of the sensor.

At step 1002 of calibration stage 1000, a known rate of rotation may be applied to a MEMS gyroscope, as described herein. By applying the known rate and measuring the in-phase and quadrature components of the sense signal, a phase of the MEMS sense displacement in response to the applied rate of rotation ($\phi_{Cor,1}$) may be determined as described herein (e.g., measuring in-phase components and quadrature components at different rates, and using the arctangent of the two signals or their ratio).

Processing may then continue to step 1004, at which an external signal may be applied to the sensor in a manner that modifies the quadrature component of the sensed signal. A phase of the MEMS sense displacement in response to the external force ($\phi_{ST,1}$) may be determined as described herein (e.g., measuring in-phase components and quadrature components in response to different external forces, and using the arctangent of the two signals or their ratio). Processing may then continue to step 1006, at which a calibration value $\phi_{DIFF}$ may be determined based on the sense displacements measured in steps 1002 and 1004, e.g., $\phi_{diff} = \phi_{Cor,1} - \phi_{ST,1}$. Processing may then exit the calibration stage 1006 and continue to step 1012 of the operational stage 1010.

At step 1012, it may be determined whether a criteria for performing operational testing is met. Operational testing may be performed at a variety of times, such as during startup or periodically while a sensor is operational (not depicted). It may also be determined whether the rate is below a threshold (e.g., less than a minimum signal that is recognized as a sensed rate versus noise) such that a response to providing an external signal may principally modify a quadrature component of a received sense signal in a predictable manner. If the measured rate is not less than the threshold, the MEMS gyroscope may continue to check the signal at step 1012. If the measured rate is less than the threshold, processing may continue to step 1014.

At step 1014, an external signal may be applied to the MEMS gyroscope, for example, by drive electrodes or drive sense electrodes (e.g., temporarily used as drive electrodes). In an exemplary embodiment the external signal may be a periodic signal having the same frequency as the drive signal. In an embodiment where the external signal is applied at a drive mass of the MEMS gyroscope, the external signal may have a predetermined phase difference (e.g., 90 degrees) from the drive signal, i.e., such that the effect of the external signal is to modify the quadrature component of the sensed signal. In other embodiments, the external signal may be applied to other masses (e.g., directly to a proof mass or to intermediate or Coriolis masses). The magnitude of the external signal may vary based on the desired change to the quadrature component of the sensed signal from the proof mass. Once the external signal has been applied to the MEMS gyroscope, processing may continue to step 1016.

At step 1016, the MEMS sense displacement may be calculated based on the applied external signal and the modification to the quadrature component caused by the applied external signal, as described herein. In an exemplary embodiment where the applied external force has the same magnitude as the external force that was applied at step 1004 of the calibration stage, any difference in response due to the external signal corresponds to changes in the operating characteristics of the MEMS gyroscopes. In other embodiments, the magnitude of the external force applied at step 1014 may be scaled compared to the external force applied at step 1004, and the resulting quadrature component output from the sense signal may be similarly scaled. The resulting effect of the external signal applied at step 1014 may then be determined as $\phi_{ST,2}$, which may be used to calculate a MEMS sense displacement value $\phi_{Cor,2}$ based on the effect of the external signal and the calibration phase difference, i.e., as $\phi_{Cor,2}=\phi_{ST,2}+\phi_{diff}$. Once the phase shift has been determined, processing may continue to step 1018.

At step 1018, the phase drift during operation of the sensor $\Delta\phi_{Cor}$ may be determined based on the original MEMS sense displacement $\phi_{Cor,1}$ from the calibration stage 1000 and the MEMS sense displacement $\phi_{Cor,2}$ from the operational stage 1010, e.g., as $\Delta\phi_{Cor}=\phi_{Cor,2}-\phi_{Cor,1}$. Processing may then continue to step 1020, at which the demodulation phase angle may be updated based on the phase drift $\Delta\phi_{Cor}$, and to step 1022 at which the angular velocity may be calculated based on the updated demodulation phase angle. Processing may then continue to step 1024.

At step 1024, it may be determined whether a re-calibration is possible, for example, during service or during a user-initiated calibration. If a re-calibration is available, processing may continue to step 1002 of calibration stage 1000. Otherwise, processing may return to step 1012.

FIG. 11 shows a flow diagram for determining a phase error based on an applied signal from quadrature tuning electrodes in accordance with some embodiments of the present disclosure. In the exemplary embodiment of FIG. 11, a DC signal may be applied to components such as quadrature tuning electrodes to impart a periodic force on a proof mass based on the drive motion of a mass that periodically overlaps the quadrature tuning electrodes, e.g., as described herein. In the exemplary embodiment of FIG. 11, the phase error may be determined at suitable times during operation of the sensor, such as during start-up of the MEMS gyroscope or at suitable times during operation.

At step 1102, the rate of rotation of a MEMS gyroscope may be measured, for example, to identify conditions where there is no rotation or very little rotation. In some embodiments, step 1102 may be associated with instructions to a user, such as to place the device including the MEMS gyroscope on a flat and stationary surface. In other embodiments, a predetermined rate signal may be applied. Processing may continue to step 1104, at which it may be determined whether the measured rate of rotation is less than a threshold. If the measured rate of rotation is not less than the threshold, processing may return to step 1102. If the measured rate of rotation is less than the threshold, processing may continue to step 1106.

At step 1106, the sense output of the MEMS gyroscope may be analyzed to determine an $\text{Offset}_1$ value from the sensed signal, which may correspond to a measured gyroscope output signal when there is no rotation of the sensor and when no quadrature tuning signal is applied to the MEMS gyroscope. Processing may then continue to step 1108.

At step 1108, the external signal may be applied to the quadrature tuning electrodes as a DC signal, with a corresponding modification to a quadrature component of the sensed signal as described herein. Processing may then continue to step 1110, in which the sense output of the MEMS gyroscope may be analyzed to determine an $\text{Offset}_2$ value, which may be representative of a measured gyroscope output with the applied external signal modifying the quadrature component and with the effect of the rate of rotation on the in-phase component being minimal. Processing may then continue to step 1112.

At step 1112, a demodulation phase angle may be applied to the sense signal. An initial demodulation phase angle may be selected to enable an iterative search routine, i.e., to identify a demodulation phase angle that substantially eliminates the quadrature component of the sensed signal while minimizing the time required for testing (e.g., to limit the amount of time that the MEMS gyroscope must remain at a zero or low rate during testing). Once the demodulation phase angle is applied, a new value for $\text{Offset}_2$ may be determined and may represent the degree to which the demodulation phase angle is capable of removing the quadrature component of the signal from the measured output of the sensed signal. Processing may then continue to step 1114.

At step 1114, a difference between $\text{Offset}_1$ and $\text{Offset}_2$ may be determined as $\text{Offset}_{DIFF}$, which may be compared to a threshold. A low value for $\text{Offset}_{DIFF}$ may correspond to the selected demodulation angle removing most of the quadrature component of the sense signal from the rate output. If $\text{Offset}_{DIFF}$ is greater than the threshold, processing may continue to step 1116 in which the demodulation phase angle is updated and applied to the quadrature component due to the external signal. If $\text{Offset}_{DIFF}$ is less than the threshold, processing may continue to step 1118.

At step 1118, the demodulation phase angle that resulted in the desired reduction of the quadrature component of the sense signal may be stored for usage in determining rate of rotation. In some embodiments, this demodulation phase angle may not be used to directly modify the demodulation of the sense signal, but may be used in post-processing to properly remove the quadrature component of the signal. The external signal applied to the quadrature tuning electrodes may be removed, and processing may continue to step 1120 to determine rate of rotation based on the updated demodulation phase angle. This processing may continue until it is desired to recalibrate the demodulation phase angle at step 1122, at which time processing may return to step 1102.

FIG. 12 shows a flow diagram for determining a phase error based on an applied signal from a quadrature tuning signal in accordance with some embodiments of the present disclosure. In the exemplary embodiment of FIG. 12, the gyroscope output signal and the quadrature component of a sensed signal under first conditions (e.g., zero or minimal rate and no applied external signal) and second conditions (e.g., zero or minimal rate and an applied external signal) may be used to modify the processing of a received sense signal during normal operation.

At step 1202, the rate of rotation of the MEMS gyroscope may be measured. In some embodiments, step 1202 may be associated with instructions to a user, such as to place the device including the MEMS gyroscope on a flat and stationary surface. Processing may continue to step 1204, at which it may be determined whether the measured rate of rotation is less than a threshold. If the measured rate of rotation is not less than the threshold, processing may return to step 1202. If the measured rate of rotation is less than the threshold, processing may continue to step 1206.

At step 1206, the sense output of the MEMS gyroscope may be analyzed to determine an $Offset_1$ value from the sensed signal, which may correspond to a measured gyroscope output signal when there is no rotation of the sensor and when no quadrature tuning signal is applied to the MEMS gyroscope. The sense output may also be analyzed to determine a $Quad_1$ value from the sensed signal, which may correspond to the quadrature component of the sensed signal. Processing may then continue to step 1208.

At step 1208, the external signal may be applied to the quadrature tuning electrodes as a DC signal, with a corresponding modification to a quadrature component of the sensed signal as described herein. Processing may then continue to step 1210, in which the sense output of the MEMS gyroscope may be analyzed to determine an $Offset_2$ value, which may be representative of a measured gyroscope output with the applied external signal modifying the quadrature component and with the effect of the rate of rotation on the in-phase component being minimal. The sense output of the MEMS gyroscope may also be analyzed to determine a $Quad_2$ value from the sensed signal, which may correspond to the quadrature component of the sensed signal when the external signal is applied. Processing may then continue to step 1212.

At step 1212, phase error may be determined from the $Offset_1$, $Quad_1$, $Offset_2$, and $Quad_2$ values. In an exemplary embodiment, this phase error $\Delta\phi_{Cor}$ may be determined based on the arctangent of these values, as follows:

$$\Delta\phi_{Cor} = \arctan\left(\frac{Offset_2 - Offset_1}{Quad_2 - Quad_1}\right) \quad (9)$$

Once the phase error has been determined at step 1212, processing may continue to step 1214. At step 1214, the demodulation phase angle may be modified based on $\Delta\phi_{Cor}$ to reduce the phase error, as described herein. In some embodiments, this demodulation phase angle may not be used to directly modify the demodulation of the sense signal, but may be used in post-processing to properly remove the quadrature component of the signal. The external signal applied to the quadrature tuning electrodes may be removed, and processing may continue to step 1216 to determine rate of rotation based on the updated demodulation phase angle. This processing may continue until it is desired to recalibrate the demodulation phase angle at step 1218, at which time processing may return to step 1202.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

Although the present disclosure has described, for example, determining a phase error by applying an external signal as a periodic signal (e.g., at drive or drive sense electrodes of a gyroscope) or applying a DC signal (e.g., by quadrature tuning electrodes) to determine a phase shift, it will be understood that the present disclosure may be applied to other methods of applying an external signal that modifies a quadrature component of a received signal of the sensor (e.g., gyroscope) in a particular manner, such that a phase error may be determined based on the change in the quadrature component.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A method for determining a phase error for a microelectromechanical system (MEMS) device, comprising:
   receiving a first signal from the MEMS device, wherein the first signal comprises an in-phase component and a quadrature component;
   applying an external signal to the MEMS device, wherein the phase of the external signal corresponds to the phase of the quadrature component;
   receiving a second signal from the MEMS device, wherein the second signal is generated by the MEMS device based on the external signal, and wherein the second signal comprises a modified in-phase component and a modified quadrature component; and
   determining the phase error for the MEMS device based on the modified in-phase component and the modified quadrature component.

2. The method of claim 1, wherein determining the phase error is based on (1) a change in amplitude between the in-phase component and the modified in-phase component and (2) a change in amplitude between the quadrature component and the modified quadrature component.

3. The method of claim 2, wherein determining the phase error further comprises determining an arctangent of the change in quadrature components and the change in in-phase components.

4. The method of claim 2, further comprising:
identifying the in-phase component from the first signal;
identifying the quadrature component from the first signal;
identifying the modified in-phase component from the second signal; and
identifying the modified quadrature component from the second signal.

5. The method of claim 1, wherein applying the external signal comprises generating an AC signal and providing the AC signal as a drive signal to the MEMS device.

6. The method of claim 5, wherein the phase of the AC signal corresponds to the phase of the quadrature component.

7. The method of claim 5, wherein generating the AC signal comprises generating a drive signal and modifying the phase of the drive signal based on a calibration factor.

8. The method of claim 1, wherein applying the external signal to the MEMS device comprises applying a DC signal to one or more DC quadrature tuning electrodes of the MEMS device.

9. The method of claim 8, wherein the MEMS device comprises a proof mass, and wherein the DC quadrature tuning electrodes are located on a substrate that is parallel to the proof mass.

10. The method of claim 1, further comprising correcting a demodulation phase angle based on the phase error.

11. The method of claim 1, further comprising:
determining a temperature of the MEMS device; and
associating the temperature with the phase error.

12. The method of claim 1, further comprising modifying a phase of a drive signal of the MEMS device based on the phase error.

13. The method of claim 1, further comprising determining that a force sensed by the MEMS device is less than a threshold, wherein the external signal is applied only when the force is less than the threshold.

14. The method of claim 1, wherein the external signal is applied periodically.

15. The method of claim 1, wherein the external signal is applied in response to a signal generated by processing circuitry of the MEMS device.

16. The method of claim 1, wherein the MEMS device comprises a MEMS gyroscope.

17. The method of claim 1, wherein applying the external signal comprises applying an electrostatic force or applying a piezoelectric force.

18. The method of claim 1, wherein the external signal comprises a sine wave or a square wave.

19. The method of claim 1, wherein the external signal comprises a periodic signal, and wherein the frequency of the periodic signal comprises an integer multiple of a drive frequency of the MEMS device.

20. A micro-electromechanical system (MEMS) device, comprising:
a suspended spring-mass system;
a sense system, wherein the sense system receives a first signal based on movement of the suspended spring-mass system, wherein the first signal comprises an in-phase component and a quadrature component;
a drive system, wherein the drive system applies an external signal to the MEMS device, wherein the phase of the external signal corresponds to the phase of the quadrature component, wherein the sense system receives a second signal generated by the suspended spring-mass system based on the external signal, and wherein the second signal comprises a modified in-phase component and a modified quadrature component; and
processing circuitry configured to determine a phase error for the MEMS device based on the modified in-phase component and the modified quadrature component.

21. A device comprising:
a sensor device configured to generate a first signal and a second signal, wherein the first signal comprises an in-phase component and a quadrature component, wherein the second signal is based on an external signal applied to the sensor device and has a phase that corresponds to the phase of the quadrature component, and wherein the second signal generated by a suspended spring-mass system comprises a modified in-phase component and a modified quadrature component; and
a processing unit configured to determine a phase error for the sensor device based on the modified in-phase component and the modified quadrature component.

* * * * *